United States Patent
Hung

(10) Patent No.: US 11,252,832 B2
(45) Date of Patent: Feb. 15, 2022

(54) DISPLAY DEVICES WITH PUSH-BUTTON ASSEMBLIES

(71) Applicant: Hewlett-Packard Development Company, L.P., Spring, TX (US)

(72) Inventor: Kuan-Jung Hung, Taipei (TW)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 16/481,467

(22) PCT Filed: Dec. 8, 2017

(86) PCT No.: PCT/US2017/065353
§ 371 (c)(1),
(2) Date: Jul. 27, 2019

(87) PCT Pub. No.: WO2019/112612
PCT Pub. Date: Jun. 13, 2019

(65) Prior Publication Data
US 2021/0289643 A1 Sep. 16, 2021

(51) Int. Cl.
*H05K 7/02* (2006.01)
*H05K 7/04* (2006.01)
*H05K 5/02* (2006.01)
*H05K 5/00* (2006.01)

(52) U.S. Cl.
CPC ........ *H05K 5/0221* (2013.01); *H05K 5/0017* (2013.01)

(58) Field of Classification Search
USPC ........................................ 361/807, 809, 810
See application file for complete search history.

(56) References Cited

U.S. PATENT DOCUMENTS

| | | | |
|---|---|---|---|
| 7,714,801 B2* | 5/2010 | Kimmel | G06F 1/1677 345/1.3 |
| 9,565,279 B2 | 2/2017 | Daniell et al. | |
| 2002/0093792 A1 | 7/2002 | Cheng | |
| 2004/0233627 A1* | 11/2004 | Anderson | G06F 1/3228 361/679.31 |

(Continued)

FOREIGN PATENT DOCUMENTS

| CN | 106502334 A | 3/2017 |
|---|---|---|
| CN | 206162259 U | 5/2017 |
| CN | 206515941 U | 9/2017 |

OTHER PUBLICATIONS

Laptop and Notebook Disassembly and Hardware Repair Guide, Aug. 28, 2009, http://www.tomsguide.com/forum/53660-35-laptop-notebook-disassembly-hardware-repair-guide.

*Primary Examiner* — Hung S. Bui
(74) *Attorney, Agent, or Firm* — HPI Patent Department

(57) ABSTRACT

Examples of display devices are described. In an example, a display device may comprise a display panel, a supporting frame to hold the display panel within a housing of the display device, and a push-button assembly. In an example, the push-button assembly comprises a tubular member having a first end and a second end. The first end is located on an external surface of the housing, while the second ends abuts a surface of the display panel. An actuator may be slidably disposed within the tubular member. Upon actuation, the actuator may slide outward of the second end to disengage the display panel from the supporting frame.

15 Claims, 5 Drawing Sheets

(56) References Cited

U.S. PATENT DOCUMENTS

| | | |
|---|---|---|
| 2012/0241303 A1 | 9/2012 | Roose et al. |
| 2016/0156107 A1 | 6/2016 | Lee |
| 2016/0233037 A1 | 8/2016 | Lee et al. |
| 2016/0380333 A1 | 12/2016 | Uttermann et al. |
| 2017/0168524 A1* | 6/2017 | Kim ................... G06F 1/1626 |
| 2019/0098775 A1* | 3/2019 | Cho ................... H01L 51/524 |

* cited by examiner

DISPLAY DEVICES WITH PUSH-BUTTON ASSEMBLIES

BACKGROUND

Electronic devices, such as laptops, tablets, and smart phones, may include display devices that are used for viewing contents, such as text and graphic images of the electronic devices. The display devices may also serve as touch-based input devices for the electronic devices.

A display device, such as a liquid crystal display (LCD) unit or a light emitting diode (LED) unit, may be mounted inside a housing which forms an enclosure. The housing may also accommodate other electronic parts, such as wireless communications circuitry, a battery, and a printed circuit board.

BRIEF DESCRIPTION OF DRAWINGS

The detailed description is described with reference to the accompanying figures. It should be noted that the description and figures are merely examples of the present subject matter and are not meant to represent the subject matter itself.

DETAILED DESCRIPTION

Figure 1:
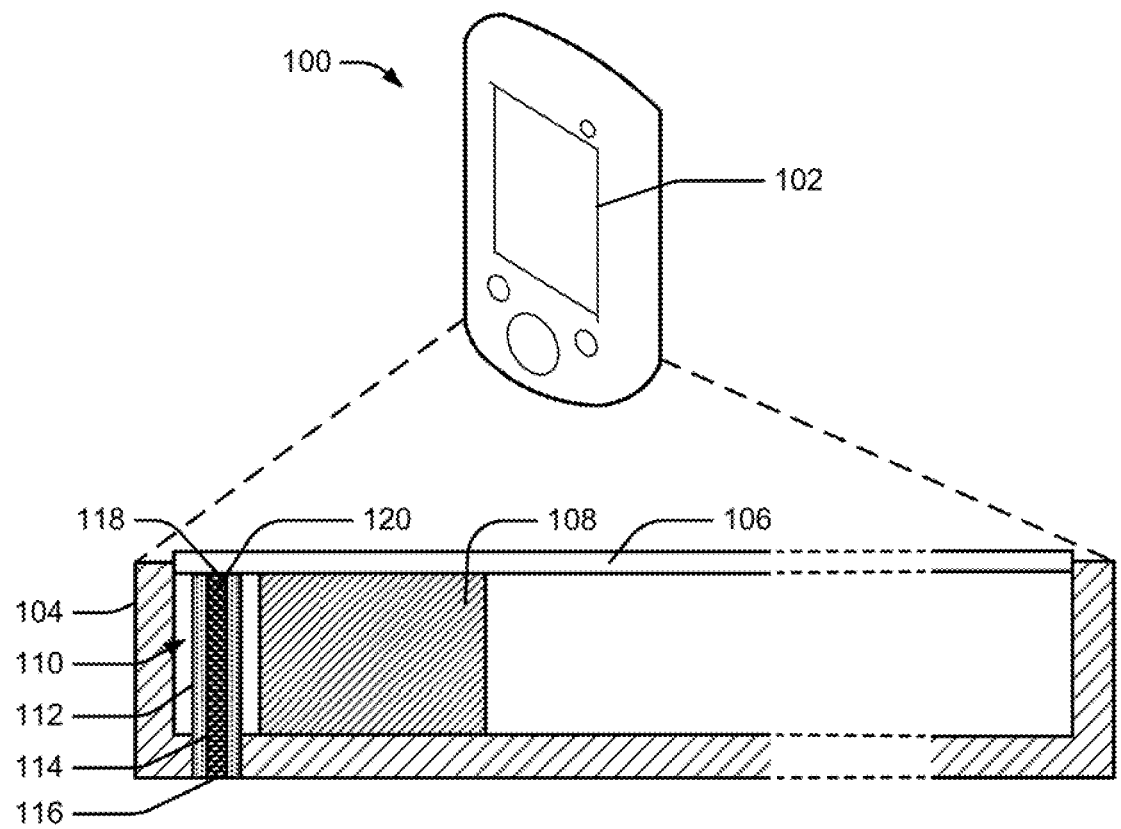
FIG. 1 illustrates an electronic device and a cross-sectional side view of a display device of the electronic device, in accordance with an example implementation of the present subject matter.

Electronic devices, such as laptops, smart phones, and tablets, include display devices, such as a liquid crystal display (LCD), as input/output devices. In an electronic device, a display device is mounted inside a housing that forms an enclosure to support and protect the display device. Among other things, the display device comprises a display panel. The display panel may be assembled on a supporting frame that holds the display panel around a periphery of the housing.

The housing may also accommodate other components of the electronic device, such as a driver integrated circuit to drive the display device, a wireless communications circuitry, a battery, and printed circuit boards. The wireless communications circuitry may include a radio-frequency transceiver circuitry and antenna elements secured within the housing. The antenna elements may be assembled on the supporting frame.

Often, the display device may be disassembled for the purposes of maintenance and repair. Generally, the disassembling may involve dismounting the display panel from the supporting frame by using pliers or sharp knife-like tools, or hands. It is observed that users often apply excess force to separate the display panel from the supporting frame, resulting in structural damage to the display panel, the supporting frame, the antenna elements, or other components that may be assembled on the supporting frame.

Further, the display panel may include a bezel to assemble the display panel onto the supporting frame. The bezel may form a part of dielectric materials provided around the antenna elements assembled within the housing. During manufacturing, operating parameters, such as frequency bandwidth and efficiency of the antenna elements may be set in accordance with the dielectric materials. Disassembling the display panel from the supporting frame by application of disproportionate force may cause deformation of the bezel. The deformation of the bezel may result in change in the dielectric materials around the antenna elements and thus, when the bezel is re-assembled into the display device, the antenna elements may observe an unexpected variation in the operating parameters.

The present subject matter relates to example implementations of display devices comprising a push-button assembly for disassembling a display panel from a supporting frame and example implementations of electronic devices that incorporate display devices with push-button assemblies.

According to an example implementation of the present subject matter, an electronic device may include a housing and a display device housed in the housing. The display device may include a display panel and a supporting frame to hold the display panel within the housing. The electronic device may include a push-button assembly for disassembling the display panel from the supporting frame. In an example, the push-button assembly comprises a tubular member that defines a cavity in the housing. The tubular member has a first end, corresponding to a first opening of the cavity, that is located on an external surface of the housing. A second end of the tubular member, corresponding to a second opening of the cavity, abuts a surface of the display panel. An actuator may be slidably disposed within the cavity. Upon actuation, the actuator may slide outward of the second opening to disengage the display panel from the supporting frame.

With the push-button assembly implemented in the housing for disassembling the display panel from the supporting frame, use of external tools may be avoided. Also, the push-button assembly may provide for application of an optimum force that may suffice to disengage the display panel from the supporting frame without causing any structural damage to the display panel, supporting frame and other components supported on the supporting frame.

In accordance with an example implementation of the present subject matter, the actuator of the push-button assembly may be actuated to disengage a bezel of the display device from the supporting frame. This mitigates the chances of deformation of the bezel, thereby nullifying the effect that variations in dielectric materials of the bezel may have on the performance of antenna elements of the electronic device located within the housing.

The above techniques are further described with reference to FIG. 1 to FIG. 8. It should be noted that the description and the figures merely illustrate the principles of the present subject matter along with examples described herein, and should not be construed as a limitation to the present subject matter. It is, thus, understood that various arrangements may be devised that, although not explicitly described or shown herein, embody the principles of the present subject matter. Moreover, all statements herein, embody the principles of the present subject matter. Moreover, all statements herein reciting principles, aspects, and implementations of the present subject matter, as well as specific examples thereof, are intended to encompass equivalents thereof.

FIG. 1 schematically illustrates an electronic device 100 and a cross-sectional view of a display device 102 of the electronic device 100, in accordance with an example implementation of the present subject matter. The electronic device 100 may be any device that comprises a display device as an output unit for presentation of information in visual form. Examples of the electronic device 100 include laptops, smartphones, tablets, e-readers, gaming consoles, remote control devices, and media players.

The electronic device 100 comprises a housing 104 for accommodating the display device 102. The housing 104 may be a box-like structure which is open from one side to expose a display panel 106 of the display device 102. The housing 104 may also accommodate other electronic components of the electronic device 100, such as a driver integrated circuit (not shown) that drives the display device, wireless communications circuitry (not shown) that implements a wireless communication functionality in the electronic device 100, a battery (not shown) that forms a part of the power supply unit of the electronic device 100, and printed circuit boards (not shown) that may incorporate various circuitries of the electronic device 100. The housing 104 may be made of materials such as plastic, metal, and reinforced fiber. The housing 104 forms an enclosure that protects the display device 102 and the other electronic parts from an external environment.

FIG. 1 depicts an example of the housing 104 considering the electronic device 100 to be a handheld device, such as a tablet, smartphone, or a notebook device that includes a single housing unit to house both the display device 102 as well as other components of the electronic device 100. However, it would be appreciated that the structure of the housing 104, as described herein, may also be applicable to other devices, such as laptops, desktops, or monitors, that include two separate housings, one for housing the display device 102 and the other for housing the input peripherals, such as a keyboard and a touchpad. In other words, the housing 104 may be a housing for the display device 102 of the electronic device 100 or a housing for the electronic device 100 itself.

In an example implementation of the present subject matter, the display device 102 may be implemented as a flat-panel display device, such as a liquid crystal display (LCD) or a light emitting diode (LED) display. The display panel 106 may be a flat rectangular plate having a predetermined thickness. In an example, the display panel 106 may be formed using multiple substrates and a backlight unit (not shown), the backlight unit being located directly behind the substrates. In an example, the display panel 106 may also include a touch screen or a touch-sensitive overlay that is attached to the display panel 106 of the display device 102.

The display device 102 comprises a supporting frame 108 to support the display panel 106. The supporting frame 108 secures the display panel 106 such that the display panel 106 does not experience any vibration or displacement in the housing 104. In accordance with one implementation, the supporting frame 108 may be a frame-like structure, made of metal or plastic, for example, to hold the display panel 106 along the periphery of the display panel 106. In an example implementation, the display panel 106 may be press-fitted on to the supporting frame 108. In other example implementation, to fasten the display panel 106 to the supporting frame 108, a double-side adhesive tape or glue may be used.

Once mounted inside the housing 104, the display panel 106 may have to be disassembled from the supporting frame 108 for maintenance or repair. In an example implementation, a push-button assembly 110 may be provided for disassembling the display panel 106 from the supporting frame 108. In an example, the push-button assembly 110 includes a tubular member 112 defining a cavity 114 in the housing 104. The tubular member 112 may be formed of metal, fiber, or plastic, such as polyvinyl chloride (PVC), in an example. The cavity 114 has a first opening 116 located on a surface of the housing 104 and a second opening 118 that abuts a surface of the display panel 106. An actuator 120 may be positioned within the cavity 114, in such a way that the actuator 120 is accessible at the first opening 116 of the cavity 114.

In operation, a user may activate the actuator 120 by applying force at the first opening 116 to press the actuator 120 inwards of the cavity 114. The actuator 120 may slide within the cavity 114 to protrude out of the second opening 118 of the cavity 114. The second opening 118 abutting the display panel 106, pushes the display panel 106 in a direction away from the supporting frame 108 to disengage the display panel 106 from the supporting frame 108.

In an example, the actuator 120 may be made of an elastic material, such as rubber. In another example, the actuator 120 may be a spring made of metal or rubber. In an assembled condition of the display device 102 when the supporting frame 108 and the display panel 106 are intact, the actuator 120 may be confined within the tubular member 112. For example, in the assembled condition, the actuator 120, such as a spring may be retained within the tubular member 112 in a compressed state, for example, by way of a constriction (not shown) provided in the cavity 114. Upon actuation, the actuator 120 may eject from the second opening 118 of the cavity 114 displacing the display panel 106 away from the supporting frame 108. For instance, in the example implementation, where the actuator 120 may be a spring, upon actuation, the spring may move to an uncompressed state causing displacement the display panel 106 away from the supporting frame 108.

In an example, the actuator 120 may be a rigid metallic or plastic member. When the user displaces one end of the actuator 120 away from the first opening 116, the corresponding displacement of the other end of the actuator 120 outward from the second opening 118, causes the displacement of the display panel 106.

In an example, the displacement of the actuator 120 applies an optimum force to disengage the display panel 106 from the supporting frame 108. The optimum force, in one example, may be understood as a magnitude of force that may suffice to disengage the display panel 106 from the supporting frame 108 without being excessive so as to cause any structural damage to the display panel 106 or the supporting frame 108. In an example, the optimum force may be based on factors, such as the size, weight, modulus of elasticity of the material of the actuator 120 and may be selected in accordance with the design of the electronic device 100.

In an example, the push-button assembly 110 may also provide for maintaining the structural integrity of the wireless communications circuitry of the electronic device 100 located in the housing 104 as explained in reference to FIG. 2 below.

Figure 2:
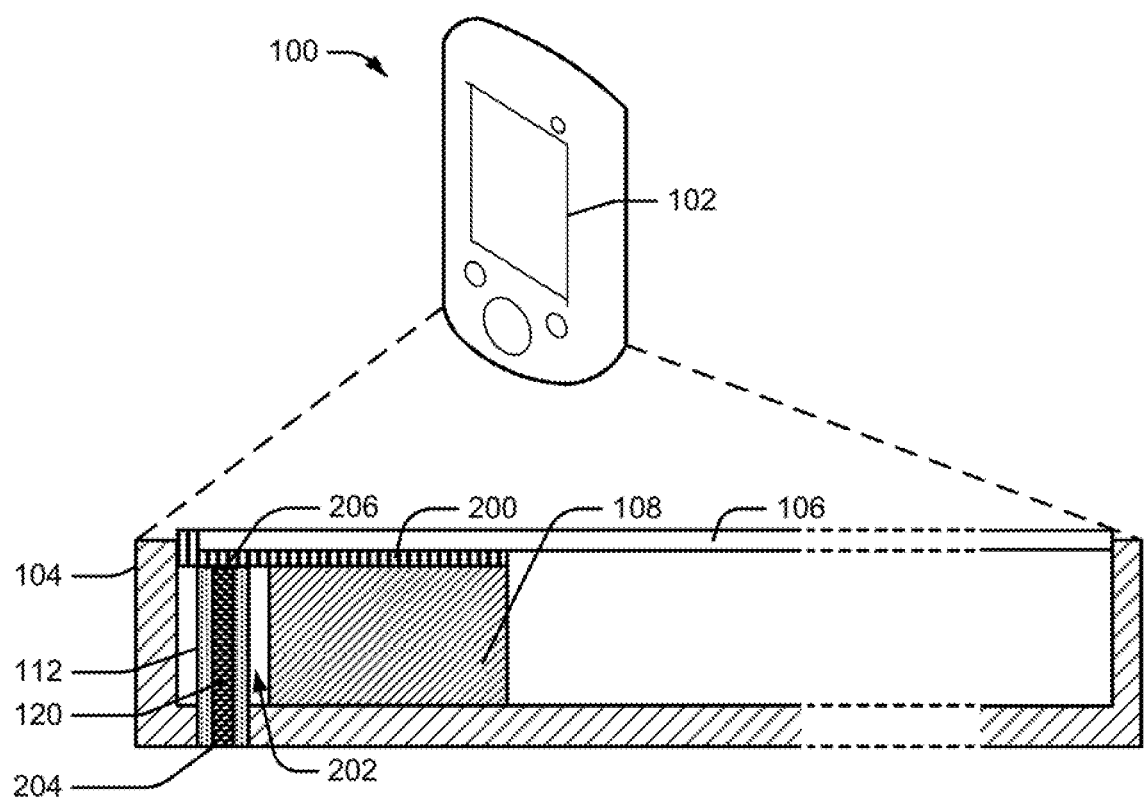
FIG. 2 illustrates an electronic device and a cross-sectional side view of a display device of the electronic device, in accordance with another example implementation of the present subject matter.

FIG. 2 illustrates the electronic device 100 in accordance with another example implementation of the present subject matter. FIG. 2 also shows a cross-sectional view of the display device 102 assembled in the housing 104 of the electronic device 100. As described above, the display device 102 may include the display panel 106, and the supporting frame 108 to hold the display panel 106 within the housing 104.

In accordance with an example implementation of the present subject matter, a bezel 200 may be disposed between the display panel 106 and the supporting frame 108 to assemble the display panel 106 on the supporting frame 108. The bezel 200 provides rigidity and structural stability to the display panel 106. For example, the bezel 200 may be a thin structure made of a plastic-like material. The bezel 200, being made of a flexible material, may help to interface a surface of the display panel 106 that may be rigid, being made of glass in an example, to a surface of the supporting frame 108.

A top surface of the bezel 200 may be affixed to the display panel 106 and a bottom surface of the bezel 200 may be affixed to the supporting frame 108. In an example, a double-side adhesive tape or glue may be used for affixing the bezel 200 to the supporting frame 108. In an example, the bezel 200 may be integral to the display panel 106. For instance, at the time of manufacturing, the display panel 106 may be provided with a plastic rim or frame at its periphery with the rim or frame serving as the bezel 200. Alternatively, the bezel 200 may be a separate component, affixed to the display panel 106 during assembling of the display device 102.

In an example, the wireless communications circuitry of the electronic device 100 may be located in the housing 104. The wireless communications circuitry may include antennas (not shown) of various types, such as chip antennas, slot antennas, inverted-F antennas, and notch antennas. In an example, the bezel 200 may form a part of dielectric materials provided around antennas of the wireless communications circuitry.

A push-button assembly 202 may be provided for disassembling the bezel 200 from the supporting frame 108. The push-button assembly 202 comprises the tubular member 112 that has a first end 204 and a second end 206. The first end 204 is located on an external surface of the housing 104 and the second end 206 is located on a surface where the bezel 200 is to couple to the supporting frame 108.

In an example, the first end 204 and the second end 206 of the tubular member 112 corresponds to the first opening 116 and the second opening 118, respectively, of the cavity 114 that the tubular member 112 defines in the housing 104. The actuator 120 may be disposed slidably within the tubular member 112, and when actuated, may eject outward of the second end 206 of the tubular member 112 as explained above, to disengage the bezel 200 from the supporting frame 108. A predetermined force that the actuator 120 exerts on the bezel 200 may prevent the bezel 200 from undergoing any deformation.

The bezel 200, as explained above, may be made of a flexible material and may be susceptible to deformation upon application of excessive force. The deformation of the bezel 200 may in turn affect, operating parameters, such as frequency bandwidth and efficiency of the antennas that are set in accordance with the dielectric material of the bezel 200 at the time of manufacturing. The actuator 120 may apply a predetermined optimum force to disassemble the bezel 200 from the supporting frame 108 without resulting in deformation of the bezel 200. The push-button assembly 202, thus, allows a disassembled bezel 200 to be re-assembled into the display device 102, without the antennas experiencing any unexpected variation in the operating parameters.

Figure 3:
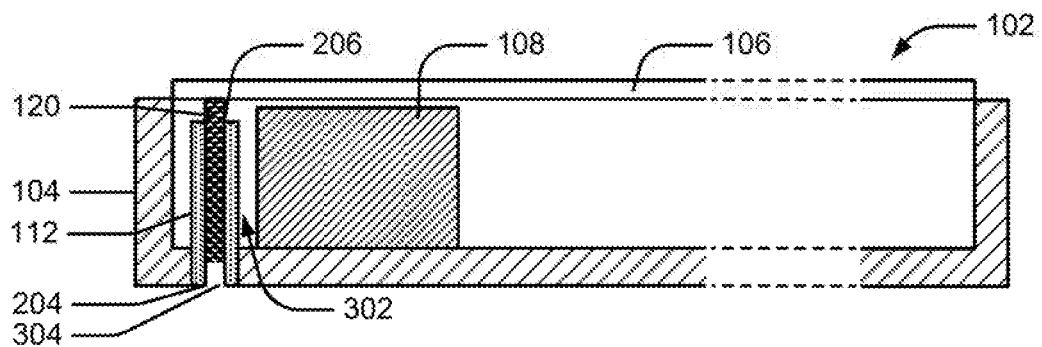
FIG. 3 illustrates a cross-sectional view of a display device comprising a push-button assembly, in accordance with an example implementation of the present subject matter.

FIG. 3 schematically illustrates a cross-sectional view of the display device 102 including a push-button assembly 302, in accordance with an example implementation of the present subject matter. Alike the example implementations described above, the display device 102 may include the display panel 106 for viewing content. The display panel 106 may be a flat-plate rectangular-shaped panel having a predetermined thickness. The display panel 106 may be implemented as a LCD, LED, or a OLED panel, for example. In an example, the display panel 106 may consist of several layers deposited on a thin glass sheet or a plastic sheet.

The display panel 106 is supported by the supporting frame 108 that holds the display panel 106 within the housing 104 of the display device 102. In an example, the display panel 106 may be press-fitted onto the supporting frame 108. Alternatively, a double-sided adhesive tape or glue may be used to affix the supporting frame 108 to the display panel 106.

The housing 104 of the display device 102 may accommodate various other components (not shown) of the display device 102, as explained above. The housing 104 may be formed from plastic, metal, or reinforced fiber, in an example. The housing 104 may include various openings (not shown) into which buttons, connectors, and the display panel 106 can be accommodated. The openings may be through-holes formed on the surface of the housing 104. The openings may be used for various purposes that involve functional considerations. In an example, the openings may be formed on the housing 104 for a power button and for a volume control switch of the display device 102. In another example, the openings may be formed in the housing 104 for external connectors, such as a headphone connector, external data connector, and a power connector.

In an example implementation of the present subject matter, alike the openings for the power button, volume control switch, and etc., the housing 104 of the display device 102 may include an opening 304 for the push-button assembly 302.

In an example implementation, the push-button assembly 302 may be secured to the housing 104 such that the first end 204 of the tubular member 112 is located at the opening 304 located on an external surface of the housing 104. The second end 206 of the tubular member 112 abuts a surface of the display panel 106 which is to rest on the supporting frame 108.

The push-button assembly 302 comprises the actuator 120 that is disposed slidably within the tubular member 112. In an example, the actuator 120 may be made of a resilient material, such as rubber. In another example, the actuator may be a spring. In an assembled state, the actuator 120 may be held in its compressed state. Upon actuation, the actuator may move to an uncompressed state to slide outward of the second end 206 of the tubular member 112. The movement of the actuator 120 disengages the display panel 106 from the supporting frame 108.

FIG. 3 depicts the actuator 120 in its actuated state. In the actuated state, the actuator 120 may protrude out of the second end 206 of the tubular member 112 towards the display panel 106. The displacement of the actuator 120 towards the display panel 106 may apply an optimum force on the display panel 106 and may disengage the display panel 106 from the supporting frame 108. Accordingly, in an example implementation, factors, such as shape, size, material, and weight of the actuator 120 that govern the predetermined optimum force that the actuator 120 may exert on the display panel 106 may be selected in accordance with a magnitude of force predetermined to be optimal for disassembling the display panel 106 from the supporting frame 108.

After the repair or maintenance, the display panel 106 may be re-assembled onto the supporting frame 108. During re-assembly, the display panel 106 may be pushed into the tubular member 112, such that the protruding end of the actuator 120 may retract away from the second end 206 of the tubular member 112. This may allow the actuator 120 to revert to the assembled state where the actuator 120 may be triggered again for disassembling the display panel 106 from the supporting frame 108.

Use of any external tools may be avoided for disassembling the display panel 106 from the supporting frame 108 with the push-button assembly 302 implemented in the housing 104. Also, the actuator of the push-button assembly 302 controls the application of force on the display panel 106. Thus, issues relating to application of disproportionate force may be prevented.

Figure 4:
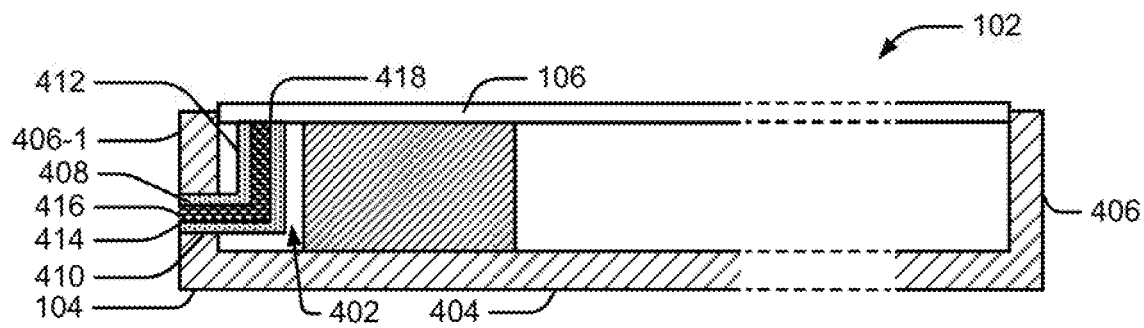
FIG. 4 illustrates a cross-sectional view of a display device including a push-button assembly, in accordance with another example implementation of the present subject matter.

FIG. 4 illustrates another example of the display device 102 including a push-button assembly 402. In an example implementation, the housing 104 of the display device 102 may include a flat base 404 and sidewalls 406 disposed on the flat base 404. In contrast to the example implementation depicted in FIG. 3, where the tubular member 302 has an l-shaped cross-section, in an example implementation as shown in FIG. 4, a tubular member 408 has a L-shaped cross-section.

Accordingly, in an example implementation, the tubular member 408 of the push-button assembly 402 may have a first portion 410 and the second portion 412 placed perpendicular to each other, such that the tubular member 408 may define a cavity 414 having a L-shaped cross section within the housing 104. The cavity 414 having the L-shaped cross-section may have two openings, a first opening 416 located on an external surface of a sidewall 406-1 and a second opening 418 that abuts the display panel 106 of the display device 102.

The components of the push-button assembly 402 and the mechanism for operating the same are similar to the push-button assemblies described in reference to FIGS. 1-3 above and are not described herein again for the sake of brevity of the present description.

Figure 5:
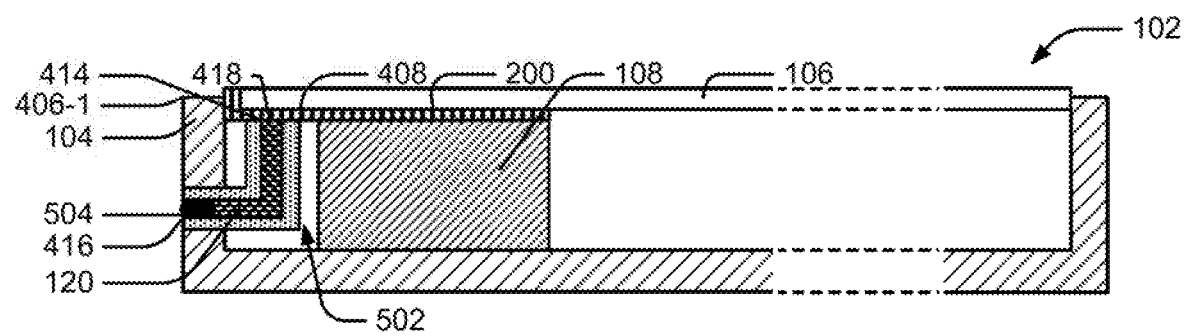
FIGS. 5 and 6 illustrate a push-button assembly for a display device in an unactuated and actuated state, respectively, in accordance with another example implementation of the present subject matter.
Figure 6:
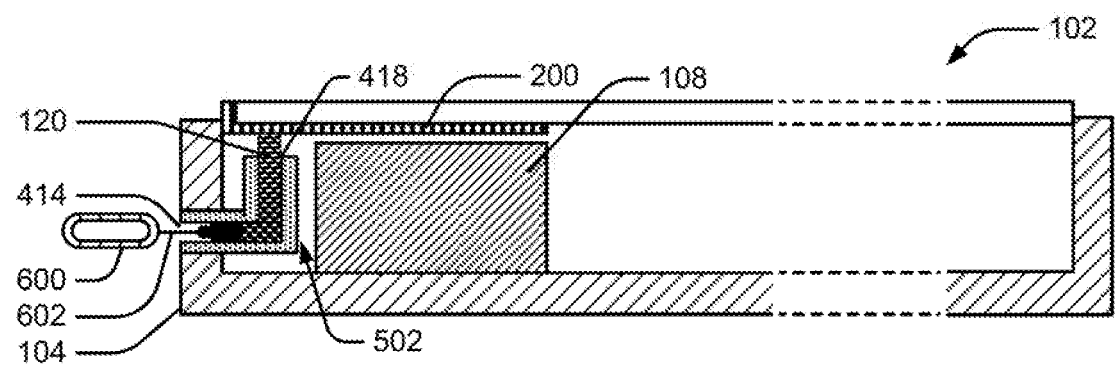

FIGS. 5 and 6 illustrate a cross-sectional view of a push-button assembly 502 for the display device 102, in accordance with another example implementation of the present subject matter. As described previously, the display device 102 comprises the display panel 106 and the supporting frame 108 to hold the display panel 106 within the housing 104. In an example, to provide rigidity and structural stability to the display panel 106, the bezel 200 may be provided between the display panel 106 and the supporting frame 108. As mentioned previously, the bezel 200 may be a flexible structure that allows for a secure fitment of the display panel 106 and the supporting frame 108.

The bezel 200 is sandwiched between the display panel 106 and the supporting frame 108 with a top surface of the bezel 200 being affixed to the display panel 106 and the bottom surface of the bezel 200 being affixed to the supporting frame 108. In an example implementation, to disassemble the display panel 106 from the supporting frame 108, the bezel 200 may be disengaged from the supporting frame 108. Accordingly, the push-button assembly 502 may provide for disassembling the bezel 200 from the supporting frame 108.

The push-button assembly 502 comprises the tubular member 408, defining the L-shaped cavity 414, enclosed in the housing 104. The cavity 414 has the first opening 416 located on an external surface of the sidewall 406-1 of the housing 104 and the second opening 418 that abuts the bezel 200. The actuator 120, when actuated, may eject out of the second opening 418 of the cavity 414 to disengage the bezel 200 from the supporting frame 108.

In an example, the push-button assembly 502 may include a contact portion 504 that may be provided at an end of the actuator 120 facing the first opening 416 for allowing a user to trigger the actuator 120. The contact portion 504 may be attached to the actuator 120 such that the contact portion 504 may be accessible from the first opening 416 of the cavity 414. In an example, the contact portion 504 may be an integral part of the actuator 120. In another example, the contact portion 504 may be externally connected to the actuator 120.

In an example implementation, the contact portion 504 may protrude out of the surface of the housing 104 of the display device 102. The protrusion may aid the user to locate and access the contact portion 504 for actuation. The contact portion 504 may be made of materials, such as metal, plastic, or hard rubber, for example.

FIG. 6 depicts the actuator 120 of the push-button assembly 502 in an actuated state. In the actuated state, the actuator 120 gets displaced from within the cavity 414 and may protrude out of the second opening 418 towards the bezel 200. The actuator 120 applies an optimum force on the bezel 200 to disengage the bezel 200 from the supporting frame 108. The optimum force may be such that deformation of the bezel 200 is avoided. Accordingly, as explained above, the operating parameters of the antennas remain consistent when the bezel 200 is re-assembled within the display device 102.

In an example, a key 600, a pin, or a similar device (not shown), may be inserted into the cavity 414 defined in the housing 104 to trigger the actuator 120 to disengage the bezel 200 from the supporting frame 108. In an example, the key 600 may have a pushrod 602 and a pushrod contact portion 604. The key 600 may be made of a metal such as a stainless steel or a plastic material, for example.

Figure 7:
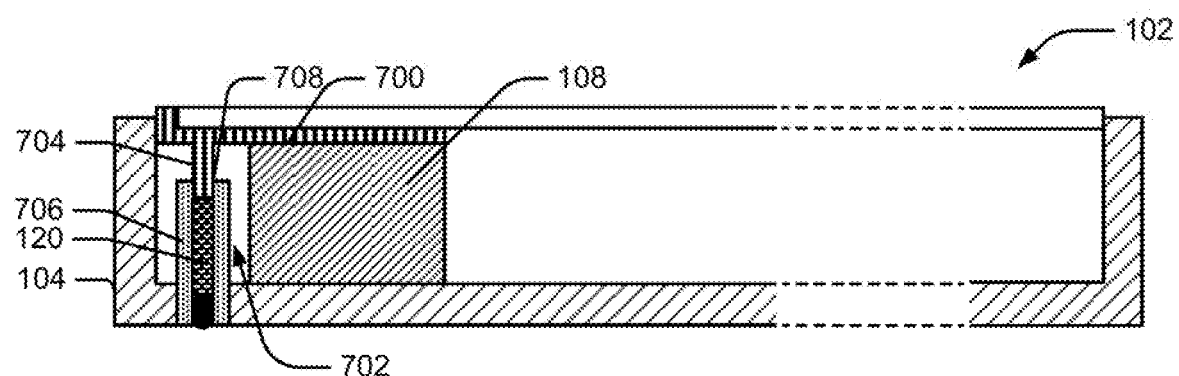
FIG. 7 illustrates a cross-sectional view of a display device showing a bezel, in accordance with an example implementation of the present subject matter.

FIG. 7 illustrates a cross-sectional view of the display device 102 for the electronic device 100 showing a bezel 700, in accordance with an example implementation of the present subject matter. In an example, a push-button assembly 702 may be provided in the housing 104 to disassemble the bezel 700 from the supporting frame 108.

In an example, a part of a bottom surface of the bezel 700 may be extended to form a retainer hook 704. In an example implementation, the retainer hook 704 may be inserted within a tubular member 706 of the push-button assembly 702 to couple the bezel 700 to the push-button assembly 702. The retainer hook 704 may be inserted within the tubular member 706 from a second end 708 of the tubular member 706, such that the retainer hook 704 abuts the actuator 120 enclosed within the tubular member 706 in an assembled state of the display panel 106.

In operation, when the push-button assembly 702 is activated, the actuator 120 slides towards the retainer hook 704 of the bezel 700. The displacement of the actuator 120 pushes the retainer hook 704 to decouple the bezel 700 from the push-button assembly 700. The retainer hook 704 moves out of the tubular member 706 to disengage the bezel 700 from the supporting frame 108.

Figure 8:
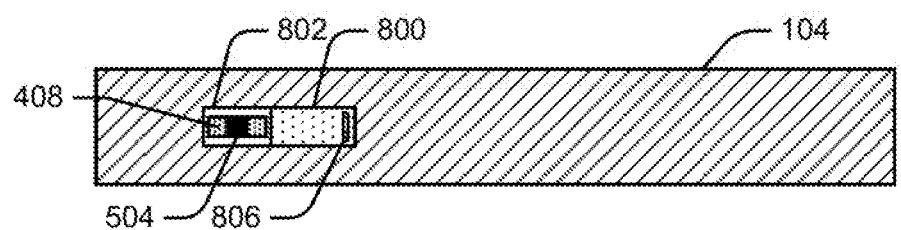
FIG. 8 schematically illustrates a housing of a display device, in accordance with an example implementation of the present subject matter.

FIG. 8 schematically illustrates the housing 104 of an electronic device 100, in accordance with an example implementation of the present subject matter. In an example, the housing 104 includes a locking member 800. The locking member 800 may be disposed over an opening 802 of the housing 104 that houses a push-button assembly 804 (not shown). As apparent from the foregoing description, the opening 802 is a first opening of a cavity that a tubular member of the push-button assembly 804 may create in the housing 104. A first end of the tubular member of the push-button assembly 804 coincides with the opening 802.

In some example implementations, the opening 802 may be located on an exterior of the flat base 404 of the housing 104 while in other example implementations, the opening 802 may be located on one of the sidewalls 406 of the housing 104. Accordingly, the locking member 800 may be disposed on the flat base 404 of the housing 104 or on any of the sidewalls 406. The example implementation illustrated in FIG. 8 shows a front view of the surface of the housing 104 that implements the locking member 800.

The locking member 800 may be made of vulcanized rubber, metal, plastic, for example. In an example, the locking member 800 may be slidable to access the actuator 120 through the opening 802. In an example, the housing 104 may include a groove 806 within which the locking member 800 may slide along the surface of the housing 104 on which the opening 802 is locate. The sliding of the locking member 800 may define a lock and an unlocked state of operation of the locking member 800.

FIG. 8 depicts an example implementation, where the locking member 800 is in the unlocked state. In the unlocked state, the push-button assembly 804 may become visible to a user. For example, the contact portion 504 of the actuator 120 may be visible to a user. In the unlocked state, the user may push the actuator 120 into the cavity, for example, using the key 600, and the push-button assembly 804 may be actuated to disengage the display panel 106 from the supporting frame 108. In the locked state, the locking member 800 may cover the opening 802. Covering the opening 802 with the locking member 800 may avoid instances where the push-button assembly 804 being inadvertently actuated by the user, for example, by accidently pushing the contact portion 504 of the actuator 120 in course of using or carrying the electronic device 100.

Although implementations for the display devices have been described in a language specific to structural features and/or methods, it is to be understood that the appended claims are not necessarily limited to the specific features or methods described. Rather, the specific features and methods are disclosed as example implementations for the display devices.

The invention claimed is:

1. A display device comprising:
a display panel;
a supporting frame to hold the display panel;
a housing to house the display panel assembled on the supporting frame; and
a push-button assembly comprising:
a tubular member comprising a first end and a second end, the first end located on an external surface of the housing and the second end abutting a surface of the display panel, wherein the surface of the display panel is to rest on the supporting frame; and
an actuator disposed slidably within the tubular member, the actuator to slide outward of the second end upon actuation to disengage the display panel from the supporting frame, wherein the actuator is accessible for actuation through the first opening from the external surface of the housing.

2. The display device as claimed in claim 1, wherein a bezel is disposed between the display panel and the supporting frame to assemble the display panel on the supporting frame and wherein the actuator is to disengage the bezel from the supporting frame upon actuation.

3. The display device as claimed in claim 1, wherein the housing comprises a flat base and sidewalls disposed on the flat base and wherein the first end of the tubular member is located on an external surface of one of the sidewalls.

4. The display device as claimed in claim 3, wherein the tubular member comprises a first portion and a second portion, the first portion and the second portion being perpendicular to each other such that the tubular member has a L-shaped cross-section.

5. The display device as claimed in claim 1, wherein the push-button assembly comprises a contact portion, wherein actuator is accessible through the first opening via engagement with the contact portion being coupled to the actuator at an end of the actuator facing the first end.

6. The display device as claimed in claim 1, wherein the housing comprises a locking member disposed over the first end, the locking member being slidable to access the actuator or a contact portion engaged with the actuator through the first end.

7. An electronic device comprising:
a housing;
a display device housed in the housing, the display device comprising:
a display panel;
a supporting frame to hold the display panel; and
a bezel disposed between the display panel and the supporting frame to assemble the display panel on the supporting frame; and
a push-button assembly secured in the housing, the push-button assembly comprising:
a tubular member comprising a first end and a second end, wherein the first end is located on an external surface of the housing and the second end is located on a surface where the bezel is to couple to the supporting frame; and
an actuator disposed slidably within the tubular member, the actuator to slide outward of the second end upon actuation to disengage the bezel from the supporting frame, wherein the actuator is accessible for actuation through the first opening: from the external surface of the housing.

8. The electronic device as claimed in claim 7, wherein the bezel comprises a retainer hook extending from a bottom portion of the bezel, the retainer hook being inserted into the tubular member to couple the bezel to the push-button assembly.

9. The electronic device as claimed in claim 7, wherein the housing comprises a locking member disposed over the first end of the tubular member, the locking member being slidable to access the actuator or a contact portion engaged with the actuator through the first end.

10. An electronic device comprising:
a housing;
a display device housed in the housing, the display device comprising:
a display panel; and a supporting frame to hold the display panel; and a push-button assembly comprising:

a tubular member defining a cavity in the housing, the cavity having a first opening and a second opening, the first opening being located on an external surface of the housing and the second opening abutting a surface of the display panel; and an actuator positioned within the cavity; the actuator being accessible at the first opening for actuation through the external surface of the housing, wherein, upon actuation, the actuator is to protrude from the second opening.

11. The electronic device as claimed in claim 10, wherein the housing comprises a flat base and sidewalls disposed on the flat base and wherein the first opening of the cavity is located on the external surface of one of the sidewalls.

12. The electronic device as claimed in claim 11, wherein the tubular member comprises a first portion and a second portion, the first portion and the second portion being perpendicular to each other such that the cavity has a L-shaped cross-section, the first opening located at one end of the first portion.

13. The electronic device as claimed in claim 10, wherein a bezel is disposed between the display panel and the supporting frame to assemble the display panel on the supporting frame and wherein the actuator is to disengage the bezel from the supporting frame upon actuation.

14. The electronic device as claimed in claim 13, wherein the bezel comprises a retainer hook extending from a bottom portion of the bezel, the retainer hook being inserted into the tubular member to couple the bezel to the push-button assembly.

15. The electronic device as claimed in claim 10, wherein the housing comprises a locking member disposed over the first opening, the locking member being slidable to access the actuator or a contact portion engaged with the actuator through the first opening.

* * * * *